US005925919A

United States Patent [19]

Kerber

[11] Patent Number: 5,925,919

[45] Date of Patent: Jul. 20, 1999

[54] CMOS SEMICONDUCTOR STRUCTURE AND PROCESS FOR PRODUCING THE SAME

[75] Inventor: Martin Kerber, Munich, Germany

[73] Assignee: Siemens Aktiengesellschaft, Munich, Germany

[21] Appl. No.: 08/869,101

[22] Filed: Jun. 4, 1997

[30] Foreign Application Priority Data

Jun. 4, 1996 [DE] Germany .......................... 196 22 415

[51] Int. Cl.[6] .......................... H01L 29/82; H01L 43/00; G01B 7/14; G01B 5/127

[52] U.S. Cl. .................. 257/421; 338/32 R; 324/207.21; 324/252; 360/113

[58] Field of Search .......................... 257/421; 338/32 R; 324/207.21, 252; 360/113

[56] References Cited

U.S. PATENT DOCUMENTS

| | | | |
|---|---|---|---|
| 4,520,413 | 5/1985 | Piotrowski et al. | 360/113 |
| 4,807,073 | 2/1989 | Takeura et al. | 360/113 |
| 5,118,382 | 6/1992 | Cronin et al. . | |
| 5,505,834 | 4/1996 | Chaug et al. | 204/192.3 |
| 5,610,099 | 3/1997 | Stevens et al. . | |

FOREIGN PATENT DOCUMENTS

| | | |
|---|---|---|
| 0 450 572 A2 | 10/1991 | European Pat. Off. . |
| 7-283300 | 10/1985 | Japan . |
| 7-283301 | 10/1995 | Japan . |

OTHER PUBLICATIONS

"A High–Performance Directly Insertable Self–Aligned Ultra–Rad–Hard . . . " (Manchanda et al.), IEEE Transactions on Electron Devices, vol. 36, No. 4, Apr. 1989, pp. 651–657.

"A High Voltage MOS Switch" (Saraswat et al.), IEEE Journal of Solid–State Circuits, vol. 10, No. 3, Jun. 1975, pp. 136–142.

*Primary Examiner*—Brian Dutton
*Attorney, Agent, or Firm*—Herbert L. Lerner; Laurence A. Greenberg

[57] ABSTRACT

A CMOS semiconductor structure and a process for producing the structure permit particularly simple, self-aligned contact-hole etching. Magnetoresistors are fully encased by a nitride layer and a lateral covering, so that the magnetoresistors are protected even in the event of misaligned contact-hole etching. The magnetoresistors, which are formed from a polysilicon layer, are etched back laterally by isotropic etching and a dielectric layer is conformally deposited so that the etched-back magnetoresistor region is thereby filled. The dielectric layer is then removed again by isotropic etching outside the etched-back magnetoresistor regions.

5 Claims, 2 Drawing Sheets

CM OS SEMICONDUCTOR STRUCTURE AND PROCESS FOR PRODUCING THE SAME

BACKGROUND OF THE INVENTION

1. Field of the Invention

The invention relates to a CMOS semiconductor structure having a substrate, a gate oxide, a polysilicon layer lying thereover to form magnetoresistors, and further layers lying thereover, in particular an oxide layer. The invention also relates to a process for producing such a CMOS semiconductor structure, in which, on a substrate, a gate oxide is produced, a polysilicon layer, a nitride layer and an oxide layer are deposited and anisotropic etching, which is masked by using a photolithography technique, is carried out as far as the gate oxide.

During the production of integrated CMOS circuits, a considerable proportion of the area is lost to electrical contacts between source and drain regions of the transistors and a first metal plane. The surface-area requirement is due, on one hand, to a minimum size of a hole and, on the other hand, to minimum separations between structure edges of the field oxide and gate electrode and other structures. The minimum separations to be retained between those structures have to accommodate the usual misalignment tolerances associated with the process. For their part, the edges of the field oxide must in turn maintain a minimum separation from the gate electrode, so that considerable separations are found overall. Overall, that results in large chip areas and large lead resistances as well as large stray lead capacitances.

Various approaches are already known for solving that problem. Thus, in particular for periodic structures of memory arrays, the contacts are to be produced by self-aligned techniques. That technique is known by the term of art "fully overlapping bit line contact". In a different approach, an overlap of the contact hole over the edge of the field oxide is permitted and the contact regions are subsequently implanted. However, that approach requires at least one additional photolithography technique, and the problem of dopant activation must be solved.

Anisotropic etching methods have also been developed, which can etch oxide selectively with respect to nitride. Using those etching methods, it is possible to carry out contact-hole etching with self-alignment with respect to previously structured nitride regions. Nevertheless, it is difficult to achieve such high selectivity, which has the consequence of limiting the maximum depth of contacts produced in that way.

SUMMARY OF THE INVENTION

It is accordingly an object of the invention to provide a CMOS semiconductor structure and a process for producing the same, which overcome the hereinafore-mentioned disadvantages of the heretofore-known devices and processes of this general type and for which self-aligned contact-hole etching can be carried out in a particularly simple manner.

With the foregoing and other objects in view there is provided, in accordance with the invention, a CMOS semiconductor structure, comprising a substrate; a gate oxide disposed on the substrate; a polysilicon layer lying over the gate oxide to form magnetoresistors with lateral boundaries; a nitride layer disposed over the magnetoresistors; a further insulating layer, such as an oxide layer, lying over the nitride layer; and a dielectric covering protecting the lateral boundaries of the magnetoresistors; the nitride layer over the magnetoresistors and the dielectric covering at the lateral boundaries of the magnetoresistors forming a continuous casing.

This provides a particularly small semiconductor structure, and the problem of etching selectivity between oxide and nitride during the self-aligned contact-hole etching is reduced.

With the objects of the invention in view there is also provided a process for producing a CMOS semiconductor structure, which comprises producing a gate oxide on a substrate; depositing a polysilicon layer, a nitride layer and an oxide layer on the gate oxide; anisotropically etching to the gate oxide by masking with a photolithography technique; laterally isotropically etching back magnetoresistor regions formed from the polysilicon layer; conformally depositing a dielectric layer filling the etched-back magnetoresistor regions; and removing the dielectric layer by isotropic etching outside the etched-back magnetoresistor regions.

Using this process, it is possible to produce the CMOS semiconductor structure according to the invention, in which a dielectric layer, in particular a nitride layer, is formed that fully encloses a thin magnetoresistor layer, and thus makes self-aligned contact-hole etching possible without encountering problems with the etching selectivity.

In accordance with another feature of the invention, the dielectric covering at the lateral boundaries of the magnetoresistors is formed of nitride. As a result, the entire casing, including the layer lying over the magnetoresistors, and the lateral boundaries of the magnetoresistors, is formed of nitride and can be processed integrally.

In accordance with a further feature of the invention, the dielectric covering at the lateral boundaries of the magnetoresistors is formed of TEOS (tetraethyl orthosilicate). When a TEOS layer is used, the gate oxide is also removed in the course of the process, or more precisely in the last step of the process according to the invention.

In accordance with a concomitant feature of the invention, the thickness of the nitride casing in the contact-hole region is preferably somewhat greater than the thickness of the magnetoresistor layer, which is typically less than 100 nm, so that reliable masking by the nitride casing can be ensured even when the etching selectivity is poor.

Other features which are considered as characteristic for the invention are set forth in the appended claims.

Although the invention is illustrated and described herein as embodied in a CMOS semiconductor structure and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
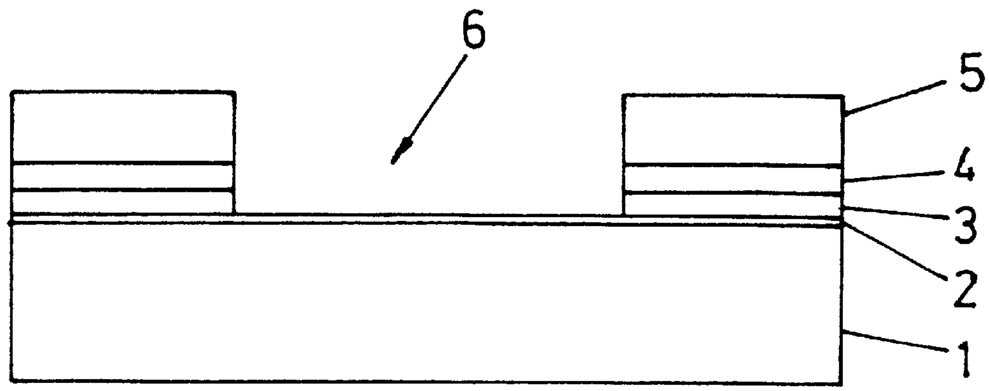
FIGS. 1 to 4 are diagrammatic, cross-sectional views of an active region of a CMOS semiconductor structure for various stages of the process according to the invention.

Referring now to the figures of the drawings in detail and first, particularly, to FIG. 1 thereof, there is seen an illustration of a process which is described below for producing a CMOS semiconductor structure according to the invention. A first gate oxide 2 is applied by deposition or thermal oxidation to an unstructured semiconductor surface, a substrate 1, and is covered with a polysilicon layer 3 which serves to produce magnetoresistors or field plates. A nitride layer 4 is applied to this magnetoresistor layer. An actual field oxide layer 5 is applied to this nitride layer 4. Using a first photolithography technique, this entire insulation stack is etched anisotropically down to the first gate oxide layer 2, in order to define an active region 6.

Figure 2:
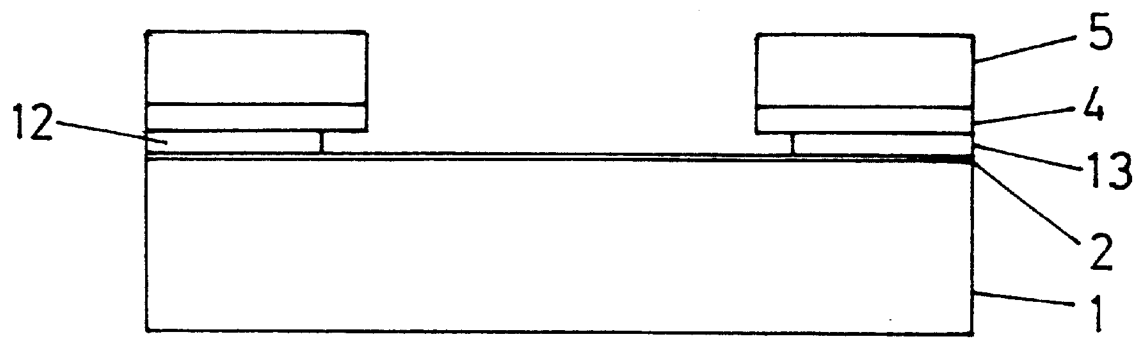

According to the invention, after the etching polymers have been removed, the polysilicon layer 3, which is also referred to as the magnetoresistor layer, is then etched back laterally by isotropic etching. This produces an overhang of the nitride layer 4 and the field oxide layer 5 over the magnetoresistors 12 and 13, which is represented in FIG. 2.

Figure 3:
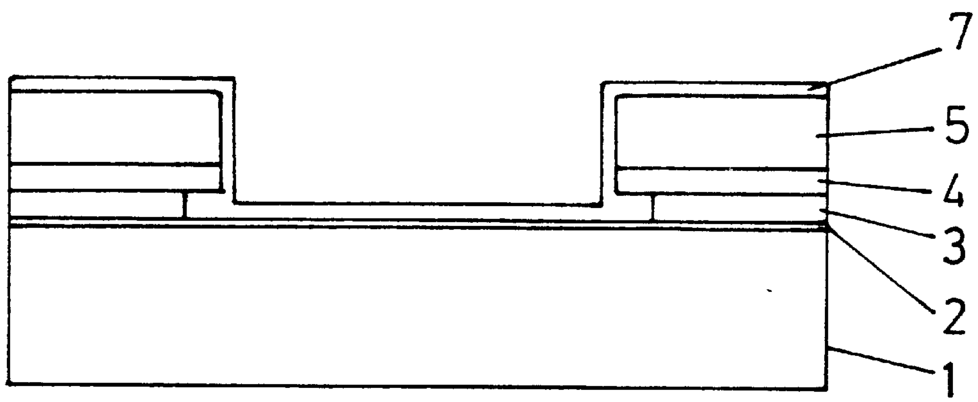
Figure 4:
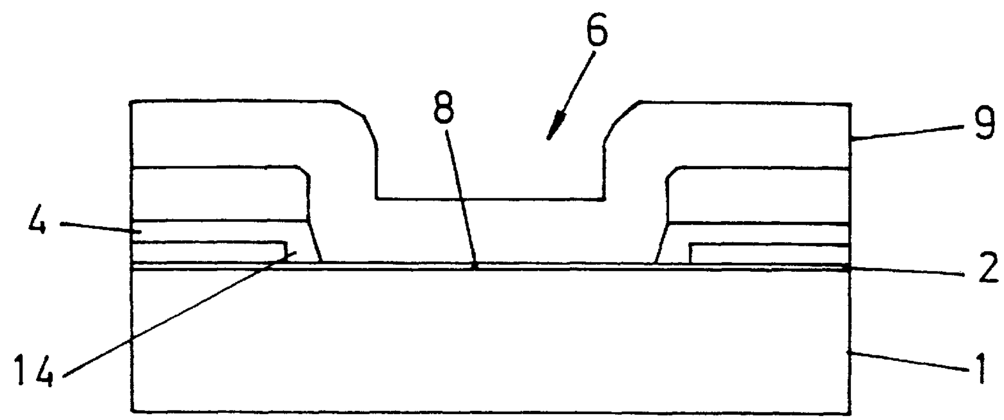

FIG. 3 represents a manner in which a nitride layer 7, or more generally a second dielectric layer, is applied, using a second, highly conformal nitride deposition, and virtually arbitrary contours are filled. In particular the etched-back region of the magnetoresistor layer is filled.

The second nitride layer 7 is removed again outside the lateral surfaces of the magnetoresistor regions through the use of isotropic nitride etching, which is highly selective with respect to oxide. This provides complete encapsulation of the magnetoresistor regions, without completely removing the first gate oxide 2 in the active regions 6. If TEOS is used instead of nitride for the second dielectric layer, then the first gate oxide 2 is also removed in the course of the isotropic etching, so that the etching step described subsequently for the use of nitride may be omitted. In this way, a lateral dielectric covering 14 is obtained in addition to the nitride layer 4 lying on the magnetoresistors 12, 13.

In the active region 6, the remaining first gate oxide 2 is then removed, and an actual gate oxide 8 is produced. The latter is covered in the active regions 6 by depositing polysilicon to produce a gate electrode 9. The production process is continued in conventional fashion with gate structuring, production of source and drain terminals and application of a planarizing oxide 10.

Figure 5:
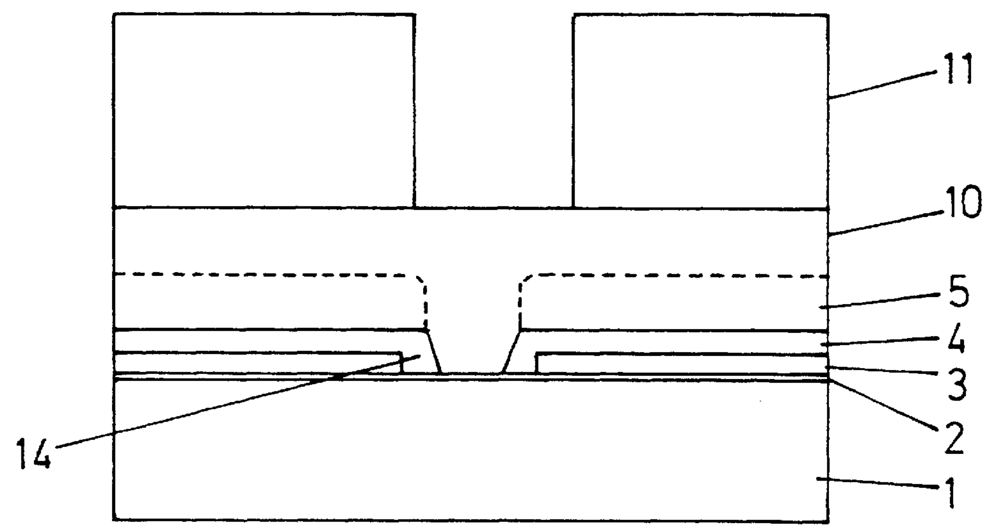
FIGS. 5 and 6 are cross-sectional views of a contact-hole region of a CMOS semiconductor structure for various stages of the process according to the invention.
Figure 6:
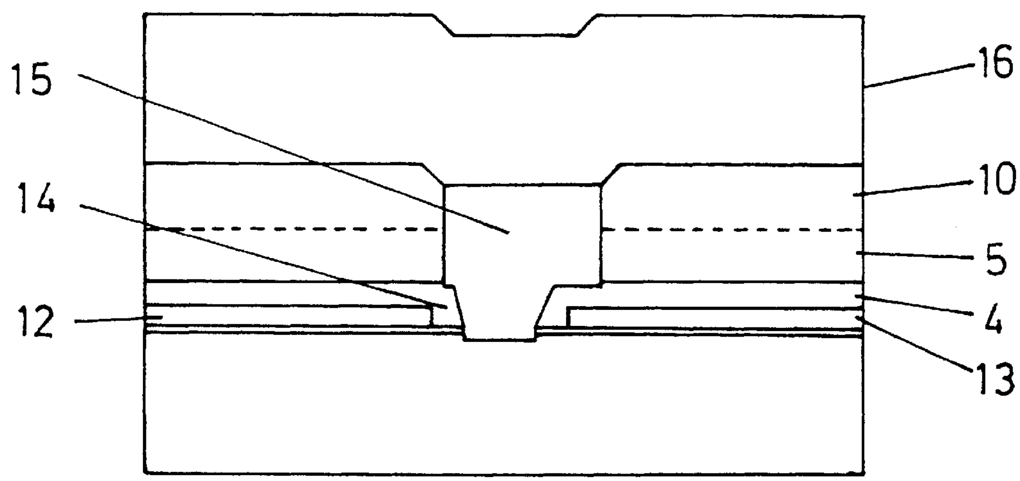

The production of contact holes is represented in FIGS. 5 and 6. The formation of a casing or jacket of the polysilicon layer 3, or of the magnetoresistor regions, is carried out in contact-hole regions in parallel and in a similar fashion to a casing or jacket of the active regions 6. The contact holes are then produced by using a photolithography technique, in which overlaps and misalignments with respect to the field insulation regions are permitted. The planarizing oxide 10 is etched anisotropically by using a resist mask 11. As soon as the etching has continued as far as the nitride encapsulation, it is masked there, whereas the etching in the contact regions exposes the substrate. The etching on the masking nitride layer 4 is indicated diagrammatically in FIG. 6. The layer thickness, in particular of the lateral portion of the encapsulation, must be selected in such a way that, for given etching selectivity and constant etching time, the nitride layer 4 remains sufficiently thick, even after the usual subsequent processing of the contact hole, so that no leakage-current path arises between the contact-hole metal and the magnetoresistor region when the operating voltage is applied. A contact-hole filling 15 and a first metal plane 16 are produced according to known processes.

I claim:

1. A CMOS semiconductor structure, comprising:

a substrate;

a gate oxide disposed on said substrate;

a polysilicon layer lying over said gate oxide to form magnetoresistors with lateral boundaries;

a nitride layer disposed over said magnetoresistors;

a further insulating layer lying over said nitride layer; and a dielectric covering protecting said lateral boundaries of said magnetoresistors;

said nitride layer over said magnetoresistors and said dielectric covering at said lateral boundaries of said magnetoresistors forming a continuous casing.

2. The CMOS semiconductor structure according to claim 1, wherein said further insulating layer is an oxide layer.

3. The CMOS semiconductor structure according to claim 1, wherein said dielectric covering is formed of nitride.

4. The CMOS semiconductor structure according to claim 1, wherein said dielectric covering is formed of TEOS.

5. The CMOS semiconductor structure according to claim 1, wherein said continuous casing is thicker than said magnetoresistors.

* * * * *